United States Patent
De Munck et al.

(10) Patent No.: US 9,537,028 B2
(45) Date of Patent: Jan. 3, 2017

(54) PINNED PHOTODIODE (PPD) PIXEL ARCHITECTURE WITH SEPARATE AVALANCHE REGION

(71) Applicants: IMEC VZW, Leuven (BE); Katholieke Universiteit Leuven, KU LEUVEN R&D, Leuven (BE)

(72) Inventors: Koen De Munck, Leuven (BE); Tomislav Resetar, Leuven (BE)

(73) Assignees: IMEC VZW, Leuven (BE); Katholieke Universiteit Leuven, KU Leuven R&D, Leuven (BE)

(*) Notice: Subject to any disclaimer, the term of this patent is extended or adjusted under 35 U.S.C. 154(b) by 0 days.

(21) Appl. No.: 14/309,712

(22) Filed: Jun. 19, 2014

(65) Prior Publication Data
US 2014/0374867 A1 Dec. 25, 2014

(30) Foreign Application Priority Data

Jun. 20, 2013 (EP) .................................. 13173087

(51) Int. Cl.
*H01L 31/0352* (2006.01)
*H01L 27/146* (2006.01)
*H01L 31/102* (2006.01)

(52) U.S. Cl.
CPC ..... *H01L 31/03529* (2013.01); *H01L 27/1461* (2013.01); *H01L 27/14643* (2013.01); *H01L 31/102* (2013.01)

(58) Field of Classification Search
CPC ........... H01L 27/1461; H01L 27/14612; H01L 27/1463; H01L 27/14643; H01L 27/14689; H01L 31/03529; H01L 31/102
See application file for complete search history.

(56) References Cited

U.S. PATENT DOCUMENTS

| | | | |
|---|---|---|---|
| 8,339,494 B1 | 12/2012 | McCarten et al. | |
| 2005/0051808 A1* | 3/2005 | Hynecek | H01L 27/14609 257/225 |
| 2007/0069315 A1* | 3/2007 | Stevens | H01L 27/14609 257/431 |
| 2011/0303822 A1 | 12/2011 | Mayer | |
| 2012/0292483 A1 | 11/2012 | Fereyre et al. | |
| 2013/0015325 A1* | 1/2013 | Ahn | H01L 27/1464 250/208.1 |

FOREIGN PATENT DOCUMENTS

| | | |
|---|---|---|
| WO | 2009/103048 A1 | 8/2009 |
| WO | 2012/032353 A2 | 3/2012 |

OTHER PUBLICATIONS

Biber, A. et al., "Avalanche Photodiode Image Sensor in Standard BiCMOS Technology", IEEE Tranactions on Electron Devices, vol. 47, No. 11, Nov. 2000, pp. 2241-2243.
(Continued)

*Primary Examiner* — Ermias Woldegeorgis
(74) *Attorney, Agent, or Firm* — McDonnell Boehnen Hulbert & Berghoff LLP

(57) ABSTRACT

Described herein is a pinned photodiode pixel architecture having a p-type substrate that is independently biased with respect to a pixel area to provide an avalanche region between an n-type region and a p-type region formed on the substrate. Such a pinned photodiode pixel can be used in imaging sensors that are used in low light level conditions.

12 Claims, 1 Drawing Sheet

(56) References Cited

OTHER PUBLICATIONS

Shimizu, Ryu et al., "A Charge-Multiplication CMOS Image Sensor Suitable for Low-Light-Level Imaging", 2009 IEEE International Solid-State Circuits Conference, ISSCC 2009 / Session 9 / Imagers / 2.7, pp. 50-51 and Visual Supplement.
European Search Report, European Patent Application No. EP 13173087, dated Sep. 10, 2013.
Kim, Young Soo et al. "Design and Characterization of CMOS Avalanche Photodiode with Charge Sensitive Preamplifier", IEEE Transactions on Nuclear Science, vol. 55, No. 3, Jun. 2008, pp. 1376-1380.
Pancheri, Lucio et al., "Low-Noise Avalanche Photodiode in Standard 0.35-um CMOS Technology", IEEE Transactions on Electron Devices, vol. 55, No. 1, Jan. 2008, pp. 457-461.

* cited by examiner

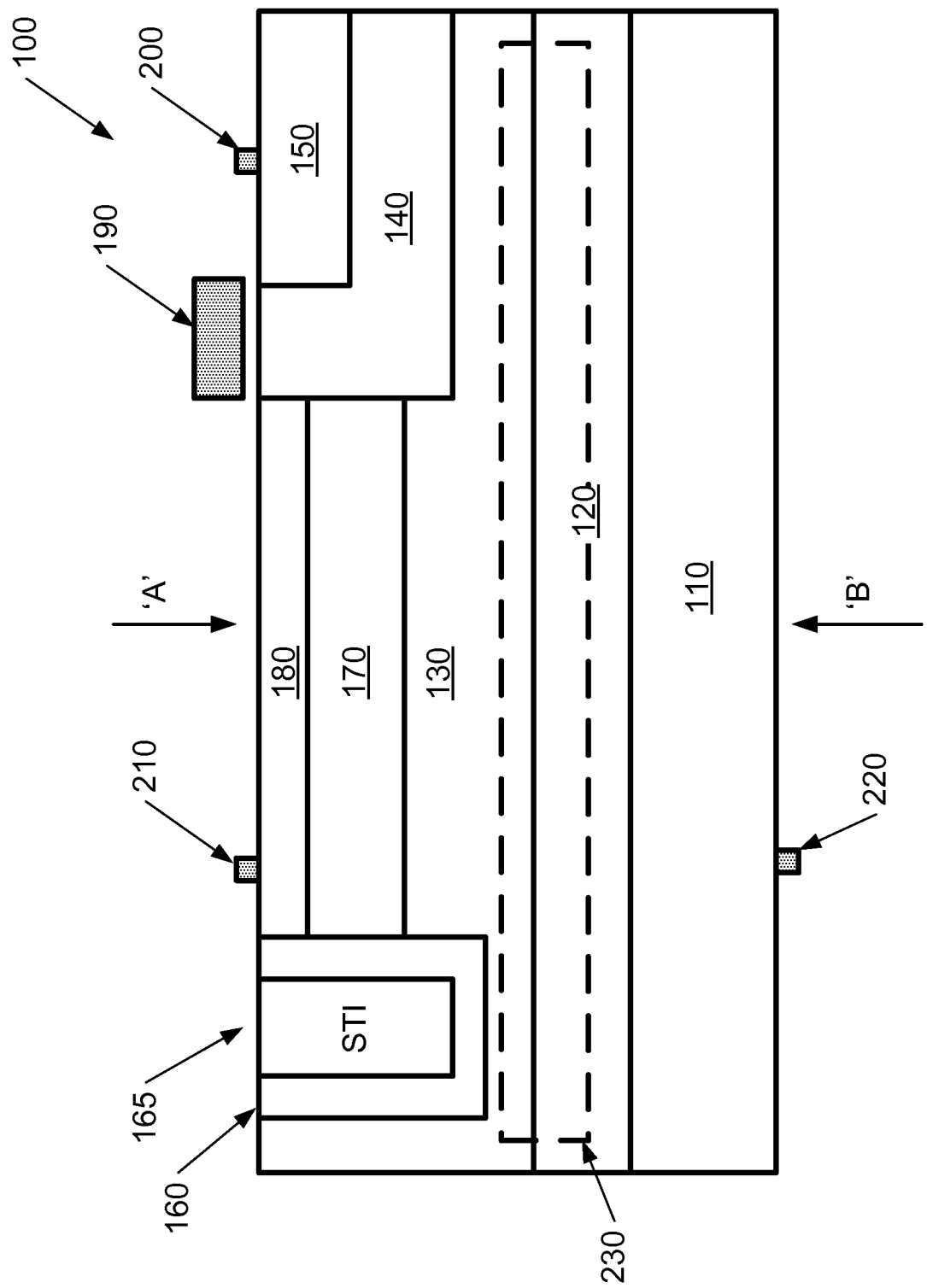

PINNED PHOTODIODE (PPD) PIXEL ARCHITECTURE WITH SEPARATE AVALANCHE REGION

CROSS-REFERENCE TO RELATED APPLICATION

This application claims priority to European Patent Application No. 13173087.1 filed on Jun. 20, 2013, the contents of which are hereby incorporated by reference.

FIELD OF THE DISCLOSURE

The present disclosure relates to pinned photodiodes for use in image sensors and, more particularly, although not exclusively, is concerned with improving intensity signals in low light image sensors.

BACKGROUND TO THE DISCLOSURE

When capturing low light intensity signals, it may be particularly important to register the light level with the lowest noise possible. Known advanced complementary metal oxide semiconductor (CMOS) image sensors (CIS) make general use of pixels with a so-called four-transistor pinned photodiode (4T-PPD) architecture. In such an architecture, the transistors are used to read out a pinned photodiode (PPD), and some of the transistors can be shared between different pixels. A PPD may help to eliminate or limit several noise sources, for example, PPD reset noise and dark current shot noise, by avoiding interaction of signal electrons with the silicon surface. As such, a PPD may help to significantly to improve signal to noise ratio (SNR). As a result, the remaining dominant noise source shifts to the rest of the readout chain, for example, source follower, column thermal noise, etc.

The design of a PPD generally includes careful optimization of doping concentrations to ensure auto-reset to a predefined pinning voltage at the point that all charges are removed from the diode and thus the diode is said to be empty. Typically, this pinning voltage lies in the range of between around 1.0V and 1.5V, with a circuit voltage, $V_{DD}$, typically around 3.3V.

SNR can be further improved in two different ways, namely, by further reducing the readout chain noise, and by amplifying the signal itself whilst introducing no or minimal additional noise. Amplification of the signal may be performed as early as possible as all noise sources at intermediate stages are also amplified.

Further, a p-n junction, when reverse biased by a sufficiently large voltage, can break down due to avalanche generation, that is, impact ionization of carriers in the space-charge region. The breakdown happens when the avalanche generation via a positive feedback goes out of control. However, the same avalanche principle can also be utilized as an amplification process when biased just below the breakdown voltage. Generally, the breakdown voltage of a silicon photodiode can be engineered by choosing the appropriate doping concentrations of the p and n side of the junction. By increasing the photodiode doping concentration, the electric field inside the junction also increases and the breakdown voltage, together with the depletion region width, decreases. However, it has been found that, at breakdown voltages below 6V as described by A. I. Biber in 2000 in his thesis entitled "Avalanche Photodiode Image Sensing in Standard Silicon BiCMOS Technology", the breakdown is primarily caused by tunnelling, rather than impact ionization. In the case where the breakdown is caused by tunnelling, there is no signal amplification.

Unfortunately, the reverse bias voltages that are used tend to be beyond what a typical CIS process are designed for, and the operating voltage range of the photodiode is normally limited by the gate oxide thickness of a CMOS transistor in a chosen technology. Whilst it is possible to increase the pinning voltage in a 4T-PPD architecture so that an avalanche photodiode can be implemented, this tends not to be practical due to changes required in the associated circuitry.

Previous attempts to utilize in-pixel avalanche photodiodes, as described by A. I. Biber mentioned above, and in 2008 by Y. S. Kim et al. in an article entitled "Design and characterization of CMOS avalanche photodiode with charge sensitive preamplifier" and by L. Pancheri et al. in an article entitled "G.F.D Low-Noise Avalanche Photodiode in Standard 0.25 µm CMOS Technology", required the use of more complex circuitry leading to poor fill factors.

In US-A-2011/0303822, US-A-2012/0292483 and in an article entitled "A charge-multiplication CMOS image sensor suitable for low-light-level imaging" by R. Shimizu et al., 2009, electron-multiplication is described to achieve avalanche amplification. However, electron-multiplication requires a high voltage capability resulting in CMOS process modification. In addition, a worse fill factor is obtained as more gates need to be employed in each pixel.

SUMMARY OF THE DISCLOSURE

As disclosed herein, the present disclosure may provide signal amplification using avalanche multiplication that does not suffer one or more of the disadvantages described above.

Further, the present disclosure may provide an avalanche photodiode in a 4T-PPD pixel architecture that is decoupled from the ground potential of the CMOS pixel and control and readout circuitry.

In accordance with a first aspect of the present disclosure, there is provided a pinned photodiode pixel architecture that includes a first doped region formed on a second doped region. The first doped region may be internally biased to a first potential. Further, a third doped region may be formed on the first doped region. The third doped region can be externally biased to a second potential. At least the second doped region may be externally biased to a third potential that is independent of the second potential to create an avalanche region between the first doped region and the second doped region.

Generally, the pinned photodiode pixel architecture in accordance with an embodiment of the present disclosure has the advantage that no additional circuitry is required as compared to a standard CIS implementation, and pixel fill factor is not affected. The provision of a third externally biased potential may also enable an avalanche region to be established, which produces signal amplification.

In one embodiment, a substrate is provided on which the second doped region is formed. The substrate may be externally biased to the third potential.

Further, a fourth doped region may be formed on the second doped region underneath the first doped region. The fourth doped region may be of a similar material type to that of the first doped region.

The terms "first", "second", "third" and "fourth" as used above with respect to the doped regions refer to the order of recitation of the regions in the claims and are not necessarily limited to the order in which the regions are formed in the pinned photodiode pixel architecture in accordance with the present disclosure. In one embodiment, the first and fourth doped regions comprise n-type regions, and the second and third doped regions comprise p-type regions.

In addition, implants may be provided that extend into at least the first doped region but may be vertically separated from the second doped region. One of the implants may include an associated doped region of opposite doping to that of the implant itself, and the implant and the doped region may define at least one transistor area. A transfer gate may be associated with the at least one transistor area. Another of the implants may include a shallow trench isolation area.

As one potential advantage, the implants may be used to isolate each pinned photodiode pixel architecture from adjacent pinned photodiode pixel architectures in the same image sensor array.

In one embodiment, the first doped region comprises an n-type material and the second doped region comprises a p-type material. In this embodiment, the third potential preferably comprises a negative potential.

The third doped region may comprise a p-type material biased to ground potential.

The second doped region may be internally biased to a pinning voltage by extracting charges via a transfer gate.

In accordance with another aspect of the present disclosure, there is provided an image sensor comprising at least one pinned photodiode pixel architecture as described herein.

In one embodiment of the present disclosure, the image sensor may comprise an image sensor array, and each sensor in the array may be a pinned photodiode pixel architecture.

BRIEF DESCRIPTION OF THE DRAWINGS

FIG. 1 illustrates a schematic view of a PPD pixel architecture in accordance with the present disclosure.

DESCRIPTION OF THE DISCLOSURE

The present disclosure will be described with respect to particular embodiments and with reference to the drawing, but the disclosure is not limited thereto. The described drawing is only schematic and is non-limiting. In the drawing, the size of some of the elements may be exaggerated and not drawn on scale for illustrative purposes.

It will be understood that the terms "vertical" and "horizontal" as used herein refer to particular orientations of the FIGURE and these terms are not limiting to the specific embodiments described herein.

Generally, a standard diode is either an n-p structure or a p-n structure. A pinned photodiode (PPD) may include a p-n-p structure, in which both p-type layers or regions are connected to the same potential, which is typically ground. The n-type layer or region is internally biased to a potential between 0 and 1.5V. The bias may be dependent on the number of charges in the n-type layer or region. In effect, a PPD is effectively two diodes arranged back-to-back.

The PPD of the present disclosure differs from a standard PPD in that the two p-type layers or regions may not be at the same potential. For instance, one p-type layer or region may be at ground potential, and the other p-type layer or region may be at a negative potential. The negative potential may be a substantial negative potential, as will be described below.

In accordance with an embodiment of the present disclosure, an avalanche photodiode is provided in which a high voltage region is separated from a low voltage region in a vertical direction to help enable a good fill-factor. In this way, a common ground potential for the avalanche photodiode and the rest of the circuitry can be avoided.

By separating the two p-type layers or regions, electrical crosstalk for a constant epitaxy (epi) thickness can be reduced without having to implement very high bias potentials to provide gain using avalanche multiplication. Alternatively, sensitivity can be improved for the same crosstalk without the implementation of very high bias potentials.

Instead of placing a standard 4T pixel in a p-type epi layer, as is common, the 4T pixel may be placed in a pixel array uniformly doped n-type layer on top of an adequately doped p-type region. The p-type region may be formed on top of a highly doped substrate. Both n-type and p-type layers can either be formed via implantation or via epitaxial growth.

Although the present disclosure will be described with reference to a 4T-PPD pixel architecture, it will be appreciated that the architecture may include more or less than four transistors per pixel. In the drawing, not all transistors are shown individually.

More than four transistors may be utilized where additional pixel circuit complexity is required. It is also possible to share transistors between pixels, for example, three transistors (not shown) can be shared between different pixels with a transfer gate being a non-shared transistor, as will be described in more detail below. As such, by way of example, a 2.5T-PPD configuration can be provided.

In addition, although the present disclosure will be described with reference to p-type implants in n-type regions, it will be appreciated that n-type implants may alternatively be provided in p-type regions with appropriate changes in voltages, for example, a change of sign or a voltage shift compared to a constant internal bias applied to the pixel.

As used herein, the values of 1e15/cm$^3$, 1e16/cm$^3$, 1e17/cm$^3$, 1e18/cm$^3$, 1e19/cm$^3$, etc., refer to concentrations of the order of $10^{15}$/cm$^3$, $10^{16}$/cm$^3$, $10^{17}$/cm$^3$, $10^{18}$/cm$^3$, $10^{19}$/cm$^3$, etc., respectively.

As shown in FIG. 1, a schematic of a PPD architecture 100 is shown in which an avalanche photodiode can be implemented. The architecture 100 includes an n-type layer or region and the ability to independently bias at least one p-type layer or region to a different potential compared to the reference potential (or ground) that is applied to the other p-type layer or region, as will be described in more detail below. In addition, this independently biased p-type layer or region may be independently biased with respect to other p-type implants, layers, or regions within the architecture.

In one embodiment, the architecture 100 comprises a p-type substrate 110 on which is formed a p-type layer or region 120. The substrate 110 has a doping concentration of between 1e18/cm$^3$ to 1e19/cm$^3$. The p-type layer or region 120 has a doping concentration of between 1e15/cm$^3$ to 1e17/cm$^3$. An n-type layer or region 130 is formed over the p-type layer or region 120 and has a doping concentration of between 1e15/cm$^3$ to 1e17/cm$^3$. It is to be noted that these doping concentrations are given by way of example only and that other doping concentrations are also possible. In addition, the doping concentration of each layer or region may vary within that particular layer or region. Within the n-type layer or region 130, a p-type implant or well 140 with an n-type layer or region 150 is formed as shown. Region 140 may also serve as a p-type well for other pixel circuitry (not shown). The p-type implant or well 140 and the n-type layer or region 150 together form a transistor area. Within the n-type layer or region 130, a p-type implant or well 160 is formed as shown. Optionally, within the p-type implant or well 160 (and/or the p-type implant or well 140), an oxide filled shallow trench isolation (STI) region 165 may be formed to further isolate different pixels and transistors from one another. In one embodiment, the STI region 165 does not touch the n-type layer or region 130.

An n-type PPD implant 170 is formed over the n-type layer or region 130 and is covered by a p-type surface implant 180. The PPD implant 170 has a doping concentration of between $1e16/cm^3$ to $1e18/cm^3$. It will readily be appreciated that PPD implant 170 may be made to expand underneath the entire pixel instead of adding n-type layer or region 130.

As shown, p-type implants or wells 140 and 160 are vertically separated from the p-type layer or region 120 by the n-type layer or region 130, for example, as shown.

A transfer gate 190 is placed on the p-type well 140 and, depending on the bias on this gate, connects the n-type layer or region 150 with PPD implant 170. A floating diffusion connection 200 is provided on the n-type layer or region 150 within the p-type well 140.

A connection 210 is made to the p-type surface implant 180, and, hence an internal connection is also made to the p-type implants or wells 140 and 160. The connection 210 is connected to a reference potential, for example, a zero or positive potential, although typically to a zero potential or ground. The position of the connection 210 to p-type surface implant 180 is by way of example and can be located in different positions in different implementations. For example, the connection 210 may be located on the top surface of the p-type implant or well 160 when the p-type implant or well 160 and the p-type surface implant 180 are to be connected.

In one embodiment, a constant negative potential is applied to the p-type substrate 110 at contact 220. As shown in FIG. 1, the p-type substrate contact 220 is illustrated as being disposed at a backside of the PPD architecture 100 by way of example and can be located in different positions in different implementations. The reference of the pixel circuitry within the p-type implant or well 140 may be fixed to one potential, for example, ground, with the substrate 110 being independently biased. This independent biasing is essential to the formation of an avalanche region 230 as indicated by the dotted lines. In this example, the avalanche region 230 is formed between the n-type layer or region 130 and the p-type layer or region 120.

In effect, as shown in FIG. 1, each layer or region of the p-n-p structure of the PPD 100 has a different bias. The top p-type layer or region, defined by the surface implant 180, is biased to the reference potential or voltage and is connected to the p-type well 140 of the transistor area. The bottom p-type layer or region, defined by the substrate 110 and/or the layer or region 120, is biased at a negative voltage as described herein. The middle n-type layer or region, defined by the PPD implant 170 and/or the n-type layer or region 130 (if present), is internally biased, and, the bias is dependent on the signal charges (electrons in this p-n-p structure) that reside in this layer or region. The bias cannot exceed the so-called "pinning voltage" as it is reached when all the charges (electrons) are extracted from the n-type layer or region via the transfer gate 190. This pinning voltage is an internal voltage which is defined by the bias of the two p-type layers or regions on either side of the n-type layer or region and is therefore not connected to any external voltage source or potential. The implant conditions for this n-type layer or region is determined by its particular pinning voltage. In addition, the bias for this n-type layer or region will not go below the value of the reference potential or voltage of the top p-type surface implant 180 as leakage currents would be obtained.

In one example, the two p-type regions, p-type surface implant 180 and p-type layer or region 120, and the substrate 110 (if present as will be described below) are isolated from one another by the n-type layer or region defined by PPD implant 170 and n-type layer or region 130 (if present). It will readily be appreciated that if the two p-type regions touch one another, current would flow between them as due to the difference in their respective independent externally applied bias.

The use of independent biasing of the two p-type layers or regions provides an extra degree of freedom that is used to enable very high bias potentials to be applied over the bottom junction between the middle n-type layer or region (defined by PPD implant 170 and n-type epi layer 130 if present) and the bottom p-type layer or region (defined by p-type epi layer 120 and substrate 110 if present). Such high bias potentials enable operation close to diode avalanche breakdown conditions. The signal that is to be detected is amplified and this is particularly important for low light level detection.

Care has to be taken, by the use of suitable doping concentrations, to ensure that parasitic devices are not created that can become active within the structure and adversely affect the operation of the pinned photodiode pixel architecture. For example, the junctions between p-type layer or region 120 and n-type layer or region 130 and p-type surface implant 180 and the PPD implant 170 should not become forward biased. Similar considerations apply to the junctions between layers or regions in the following groupings: layers or regions 140, 130, 120; layers or regions 160, 130, 120; and layers or regions 150, 140, 130, 120.

Whilst the embodiment described with reference to FIG. 1 is typically used with front illumination (from above as shown by arrow 'A'), only the carriers originating from longer wavelength photons will be amplified depending on the junction depth.

In another embodiment, when back illuminated (from below as shown by arrow 'B' in FIG. 1), the substrate 110 is not required and the connection 220 may be formed directly on the p-type layer or region 120 after appropriate surface treatment to the backside thereof as will be appreciated by those skilled in the art.

Only the carriers generated in the p-type layer or region 120 will experience avalanche multiplication while those generated in layers above, for example, n-layer or region 130, will directly diffuse towards the PPD 170 where the charge integration takes place. In illumination from the front side, this causes a significant non-uniform amplification over wavelength. In illumination from the backside, only part of the carriers originating from the light of longest wavelengths will remain unamplified. After integration, the collected charges would be transferred via the transfer gate 190 to the floating diffusion node 200. The p-well 140 would be a constant and independent reference for the circuitry at, for example, 0V (or ground) whereas the p-type substrate 110 would be biased at some constant negative potential Vh at 220. The value of Vh would be determined by the choice of the p-type layer or region 120 doping concentration and n-type doping concentration of the n-type layer or region 130. Vh may have a value in the range of −200V to −5V, typically around −20V. Naturally, if the substrate 110 is removed in back illumination situations, the value of Vh will not change.

It will readily be understood that the peripheral circuitry of a PPD pixel architecture in accordance with the present disclosure may require special attention to be able to manage the large negative substrate voltage.

It is may be important that each pixel keeps its own charge and barriers (typically electrostatic potential barriers of a suitable magnitude and which are not explicitly shown) are provided under the STI passivation implant 160 and the p-well 140 to prevent the transfer of charge from one pixel to neighboring pixels through the n-type layer or region 130.

The layers or regions and implants may be silicon-based with appropriate doping. However, the disclosure is not limited to silicon-based technology and any other suitable material used in conventional semiconductor technology may be used with appropriate doping concentrations to form the avalanche region 230 under the independent negative bias applied at 220.

In the embodiment described in the present disclosure, there is no need for additional CMOS circuitry to address and to readout a pixel array as compared to a standard CIS. Rather, merely a constant high negative bias needs to be provided which is common to all pixels.

Further, the existing pixel circuitry does not need to be adapted. This means that in the pixel no technology changes are required except for an optimization of PPD implants. In addition, the same design and layout options are available as for state-of-the-art CIS, concerning pixel transistor sharing, general scaling, etc. Fill factor is therefore not affected as compared to standard CIS and may be better than other avalanching alternatives.

Signal amplification mainly occurs for low light level signals and less for higher light levels. This is because the amplification factor is strongly dependent on the voltage in the PPD that in turn depends on the amount of collected charge. The response is thus non-linear in such way that it increases the dynamic range.

The possible application of such a pixel would be in low-light level imaging in various fields of technology including, but not limited to, bio sciences, for example, fluorescence detection, and surveillance cameras or even consumer cameras operating in near-dark conditions. Other fields of application can be found in high dynamic range imaging.

Whilst an embodiment has been described which has specific characteristics, it will be appreciated that embodiments having slightly different characteristics are also possible.

The invention claimed is:

1. A pinned photodiode pixel architecture comprising:
 a first doped region formed over a second doped region, wherein the first doped region is internally biased to a first potential; and
 a third doped region formed over the first doped region, wherein the third doped region is externally biased to a second potential,
 wherein at least the second doped region is externally biased to a third potential that is independent of the second potential to create an avalanche region between the first doped region and the second doped region,
 and wherein each of the first doped region, the second doped region, and the third doped region has a different bias.

2. The pinned photodiode pixel architecture according to claim 1, further comprising a substrate over which the second doped region is formed, wherein the substrate is externally biased to the third potential.

3. The pinned photodiode pixel architecture according to claim 2, further comprising a fourth doped region formed over the second doped region and underneath the first doped region, wherein the fourth doped region is made of a similar material type to that of the first doped region.

4. The pinned photodiode pixel architecture according to claim 3, further comprising first and second implants extending into at least the first doped region and vertically separated from the second doped region.

5. The pinned photodiode pixel architecture according to claim 4, wherein at least the first implant includes an associated doped region of opposite doping to that of the first implant itself, wherein the first implant and the doped region define at least one transistor area.

6. The pinned photodiode pixel architecture according to claim 5, further comprising a transfer gate associated with the at least one transistor area.

7. The pinned photodiode pixel architecture according to claim 6, wherein the second doped region is internally biased to a pinning voltage by extracting charges via the transfer gate.

8. The pinned photodiode pixel architecture according to claim 4, wherein at least the second implant includes a shallow trench isolation area.

9. The pinned photodiode pixel architecture according to claim 1, wherein the first doped region comprises an n-type material and the second doped region comprises a p-type material.

10. The pinned photodiode pixel architecture according to claim 9, wherein the third potential is a negative potential.

11. The pinned photodiode pixel architecture according to claim 10, wherein the third doped region comprises a p-type material biased to ground potential.

12. An image sensor comprising at least one pinned photodiode pixel architecture according to claim 1.

* * * * *